(12) United States Patent
Bae et al.

(10) Patent No.: US 10,651,526 B2
(45) Date of Patent: May 12, 2020

(54) FLEXIBLE FLAT CABLE COMPRISING STACKED INSULATING LAYERS COVERED BY A CONDUCTIVE OUTER SKIN AND METHOD FOR MANUFACTURING

(71) Applicant: SAMSUNG ELECTRONICS CO., LTD., Suwon-si, Gyeonggi-do (KR)

(72) Inventors: Bum-hee Bae, Seongnam-si (KR); Young-kun Kwon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/630,101

(22) Filed: Jun. 22, 2017

(65) Prior Publication Data
US 2018/0053981 A1    Feb. 22, 2018

(30) Foreign Application Priority Data

Aug. 16, 2016 (KR) .................. 10-2016-0103808
Apr. 4, 2017 (KR) .................. 10-2017-0043851

(51) Int. Cl.
| | |
|---|---|
| *H01P 3/08* | (2006.01) |
| *H01B 7/08* | (2006.01) |
| *H01P 11/00* | (2006.01) |
| *H01B 13/00* | (2006.01) |
| *H01P 5/02* | (2006.01) |
| *H05K 1/02* | (2006.01) |

(52) U.S. Cl.
CPC ............. *H01P 3/08* (2013.01); *H01B 7/0807* (2013.01); *H01B 7/0823* (2013.01); *H01B 13/0036* (2013.01); *H01P 3/085* (2013.01); *H01P 5/028* (2013.01); *H01P 11/003* (2013.01); *H05K 1/0218* (2013.01)

(58) Field of Classification Search
CPC .. H01P 3/08; H01P 3/085; H01P 3/082; H01P 3/026; H01P 3/06; H01P 11/003
USPC ......................................... 333/238
See application file for complete search history.

(56) References Cited

U.S. PATENT DOCUMENTS

| | | | |
|---|---|---|---|
| 4,845,311 A | | 7/1989 | Schreiber et al. |
| 5,317,292 A | * | 5/1994 | Leeb ............. H01P 3/085 29/830 |

(Continued)

FOREIGN PATENT DOCUMENTS

| | | |
|---|---|---|
| JP | 07-212043 | 8/1995 |
| JP | 08-237009 | 9/1996 |

(Continued)

*Primary Examiner* — Benny T Lee
(74) *Attorney, Agent, or Firm* — Nixon & Vanderhye P.C.

(57) ABSTRACT

A flexible flat cable and a manufacturing method thereof are provided. The flexible flat cable includes a plurality of ground parts comprising a conductive material disposed at intervals, a plurality of signal transmission parts comprising a conductive material disposed between the plurality of ground parts, an outer skin covering the signal transmission parts and the ground parts, and a conductive adhesive layer disposed between the ground parts and the signal transmission parts and the outer skin part, the signal transmission part comprising an insulating member and a strip line disposed within the insulating member and the ground part comprising a ground member having the same cross section as the strip line and a conductive adhesive block coupled to the ground member with the conductive adhesive layer.

17 Claims, 21 Drawing Sheets

(56) References Cited

U.S. PATENT DOCUMENTS

| | | | |
|---|---|---|---|
| 6,388,198 B1 | 5/2002 | Bertin et al. | |
| 6,466,112 B1 | 10/2002 | Kwon et al. | |
| 6,703,114 B1 | 3/2004 | Guiles et al. | |
| 6,917,262 B2* | 7/2005 | Poire | H01P 3/088 |
| | | | 257/664 |
| 6,943,452 B2 | 9/2005 | Bertin et al. | |
| 7,690,922 B2 | 4/2010 | Huang | |
| 8,546,688 B2 | 10/2013 | Horan et al. | |
| 8,878,065 B2 | 11/2014 | Lin | |
| 9,520,643 B2 | 12/2016 | Shiu et al. | |
| 2005/0057327 A1 | 3/2005 | Kwon et al. | |
| 2012/0228006 A1* | 9/2012 | Chen | H05K 1/0224 |
| | | | 174/251 |
| 2014/0159836 A1* | 6/2014 | O'Neil et al. | H01P 11/003 |
| | | | 333/246 |
| 2014/0306845 A1 | 10/2014 | Shiu et al. | |
| 2016/0028140 A1* | 1/2016 | Kato | H05K 1/0242 |
| | | | 333/238 |
| 2016/0329130 A1 | 11/2016 | Evans et al. | |
| 2017/0194686 A1* | 7/2017 | Ito et al. | H01P 3/026 |

FOREIGN PATENT DOCUMENTS

| | | |
|---|---|---|
| JP | 2938341 | 8/1999 |
| JP | 3498386 | 2/2004 |
| KR | 10-0308871 | 11/2001 |
| KR | 10-2004-0036021 | 4/2004 |
| KR | 10-2005-0083769 | 8/2005 |
| KR | 10-0538470 | 12/2005 |
| KR | 10-0573494 | 4/2006 |

* cited by examiner

FLEXIBLE FLAT CABLE COMPRISING STACKED INSULATING LAYERS COVERED BY A CONDUCTIVE OUTER SKIN AND METHOD FOR MANUFACTURING

CROSS-REFERENCE TO RELATED APPLICATIONS

This application is based on and claims priority under 35 U.S.C. § 119 to Korean Patent Application No. 10-2016-0103808, filed on Aug. 16, 2016 in the Korean Intellectual Property Office and Korean Patent Application No. 10-2017-0043851, filed on Apr. 4, 2017, in the Korean Intellectual Property Office, the disclosures of which are incorporated by reference herein in their entireties.

BACKGROUND

Field

The present disclosure relates generally to a flexible flat cable, and for example, to a flexible flat cable and a method for manufacturing the same.

Description of Prior Art

Coaxial cables have been used to shield signals in the related arts. But the coaxial cables may have a limited usage field due to the high cost. The related flexible flat cables using an impedance matching film may be cheaper than the coaxial cables. However, the related flexible flat cables may not completely cover signal lines and thus shielding on the signals may not be completely accomplished. Accordingly, crosstalk between signals may occur. Cables that have a conductive material which is filled within a via formed by etching a printed circuit board (PCB) may not also completely cover signal lines and thus a shielding efficiency may be degraded.

SUMMARY OF THE INVENTION

Example embodiments are provided to address the above disadvantages and other disadvantages not described above.

One or more example embodiments relate to a flexible flat cable having a structure wherein various types of signal transmission lines are completely covered using a shield film to which a conductive adhesive is attached and a method for manufacturing the same.

According to an aspect of an example embodiment, a flexible flat cable is provided, the flexible flat cable including a plate-like insulator; a signal transmission member comprising a conductor disposed within the insulating part; an outer skin covering the insulating part; and a conductive adhesive layer disposed between the insulator and the outer skin.

The signal transmission member may include a strip line.

The signal transmission member may include a pair of strip lines disposed to be spaced at intervals.

The insulator may include a first coverlay and a second coverlay laminated on the first coverlay and having a smaller width than the first coverlay. The flexible flat cable may further include a pair of ground members disposed in portions of the first coverlay on which the second coverlay is not laminated.

The pair of ground members may be disposed with the signal transmission member interposed therebetween.

Portions of the pair of ground members may be covered with the second coverlay.

The signal transmission member may include a pair of strip lines disposed to be spaced at intervals.

The flexible flat cable may further include a pair of ground members buried within the insulator and disposed to be spaced in both sides of the signal transmission member. The conductive adhesive layer may protrude toward an inner side of the insulator and may be electrically coupled to the pair of ground members.

A cross section of each of the ground members may have the same shape as that of the strip line.

The conductive adhesive layer may include a pair of connection protrusions coupled to a top surface and a bottom surface of the insulating part.

The pair of ground members and the signal transmission member may be configured of a conductive material.

The pair of ground members and the conductive adhesive layer may completely cover the signal transmission member.

The outer skin part may be configured of a conductive film.

The flexible flat cable may further include a conductive pattern electrically coupled to one end of the flexible flat cable.

A step portion which exposes the signal transmission member may be formed in at least one end of the flexible flat cable so that the flexible flat cable is electrically coupled to another flexible flat cable. The step portions of the flexible flat cables may be coupled to face each other.

According to an aspect of an example embodiment, a flexible flat cable is provided, the flexible flat cable including a plurality of ground parts disposed at intervals; a plurality of signal transmission parts disposed between the plurality of ground parts; an outer skin covering the signal transmission parts and the ground parts; and a conductive adhesive layer disposed between the ground parts, the signal transmission parts and the outer skin. Each of the signal transmission parts may be comprised of an insulating member and a strip line buried within the insulating member. Each of the ground parts may be comprised of a ground member and a conductive adhesive block coupled to the ground member with a conductive adhesive layer.

The plurality of ground parts and the conductive adhesive layer may completely cover the signal transmission parts.

The signal transmission part may have an additional strip line disposed at interval from the strip line.

The conductive adhesive block may be disposed in a top surface and a bottom surface of the ground member.

According to an aspect of an example embodiment, a method for manufacturing a flexible flat cable is provided, the method including providing a first coverlay including a copper thin film layer formed in one surface; etching a portion of the copper thin film layer; laminating a second coverlay on the etched copper thin film layer; and covering the first and second coverlays with a shield film to which a conductive adhesive is applied.

The etching may include forming a single strip line or a pair of strip lines.

The etching may include forming a pair of ground members disposed to be spaced in both sides of the strip line.

The laminating of the second coverlay may include covering the strip line.

The laminating of the second coverlay may include laminating the second coverlay including a longitudinal groove having a shape corresponding to the strip line and the ground member in a position corresponding to the strip line and the ground member. The covering of the first and second coverlays with the shield film to which the conductive adhesive is applied may include filling the conductive adhesive within the longitudinal groove of the second coverlay.

The method may further include, after the laminating of the second coverlay, etching a portion of the first coverlay corresponding to the pair of ground members.

Additional aspects and advantages of the example embodiments are set forth in the detailed description, and will be apparent from the detailed description.

BRIEF DESCRIPTION OF THE DRAWINGS

The above and/or other aspects, features and attendant advantages of the present disclosure will be more apparent from the following detailed description, taken in conjunction with the accompanying drawings, in which like reference numerals indicate like parts throughout the several views, and wherein.

DETAILED DESCRIPTION OF THE INVENTION

Figure 1:
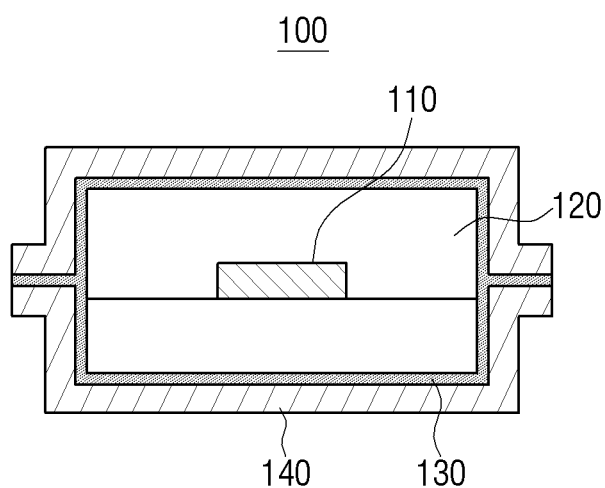
FIG. 1 is a cross-sectional diagram illustrating an example flexible flat cable according to an example embodiment.

Various example embodiments will now be described in greater detail with reference to the accompanying drawings in which various embodiments are illustrated. The techniques described herein are examples, and should not be construed as implying any particular limitation on the present disclosure. It should be understood that various alternatives, equivalents and/or modifications could be devised by those skilled in the art. In the following disclosure, unless otherwise described, the same reference numerals are used for the same elements when they are depicted in different drawings.

It will be understood that, although the terms "first", "second", etc. may be used herein in reference to elements of the disclosure regardless of an order and/or importance, such elements should not be construed as limited by these terms. The terms are used only to distinguish one element from other elements. For example, without departing from the spirit of the disclosure, a first element may refer to a second element, and similarly, the second element may refer to the first element.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. The terminology used herein is for the purpose of describing particular embodiments only and is not intended to be limiting of the disclosure. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, even where the terms are defined in the disclosure, the terms should not be interpreted to exclude embodiments herein.

Hereinafter, a flexible flat cable and a method for manufacturing the same according to an example embodiment will be described with reference to the accompanying drawings.

FIG. 1 is a cross-sectional diagram illustrating an example flexible flat cable according to an example embodiment.

Referring to FIG. 1, a flexible flat cable 100 may include a signal transmission member 110, an insulating part 120, a conductive adhesive layer 130, and an outer skin part 140.

The signal transmission member 110 may be buried within an inside of the insulating part 120 and an exposed surface of the insulating part 120 may be covered with the outer skin part 140. The insulating part 120 and the outer skin part 140 may be attached through the conductive adhesive layer 130. Accordingly, the conductive adhesive layer 130 may be formed between the insulating layer 120 and the outer skin part 140.

The conductive adhesive layer 130 may cover the insulating part 120 to shield the signal transmission member 110 and thus the crosstalk of a signal transmitted to the signal transmission member 110 in the inside of the insulating part 120 due to an external signal may be reduced.

The outer skin part 140 may be configured of a conductive film. The shield efficiency may be changed according to an amount of a conductive material contained in a conductive adhesive which is an ingredient of the conductive adhesive layer 130. The outer skin part 140 may be optionally configured of a conductive material or a nonconductive material in consideration of the shield efficiency of the conductive adhesive layer 130. For example, in response to the shield efficiency of the conductive adhesive layer 130 being small, the outer skin part 140 may be configured of the conductive material to supplement the shield performance of the conductive adhesive layer 130. In another example, in response to the shield efficiency of the conductive adhesive layer 130 being large, the outer skin part 140 may be configured of the nonconductive material. The signal transmission member 110 may be a signal transmission line configured of a strip line and a material for the signal transmission member 110 may be configured of a conductive metal such as copper.

FIGS. 2A, 2B, 2C and 2D are diagrams illustrating an example manufacturing process of the flexible flat cable illustrated in FIG. 1.

The flexible flat cable may be manufactured using a process for manufacturing a flexible circuit or a flexible cable such as a flexible PCB (FPCB) process or a flat flexible cable (FFC) process.

Figure 2A:
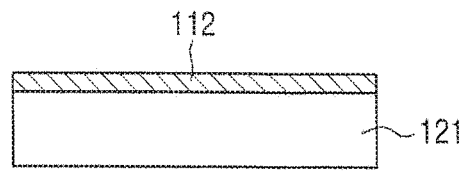
FIGS. 2A, 2B, 2C and 2D are diagrams illustrating an example manufacturing process of the flexible flat cable of FIG. 1 according to an example embodiment.

As illustrated in FIG. 2A, a first coverlay 121 of having a copper thin film layer 112 formed in one surface may be prepared. For example, the first coverlay 121 may be configured of an insulator.

Figure 2B:
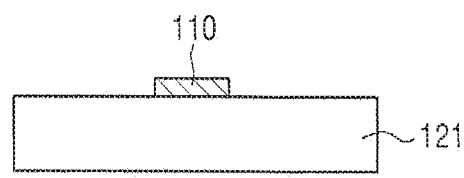

As illustrated in FIG. 2B, a portion of the copper thin film layer 112 is etched to form the signal transmission member 110 configured to transmit a signal.

Figure 2C:
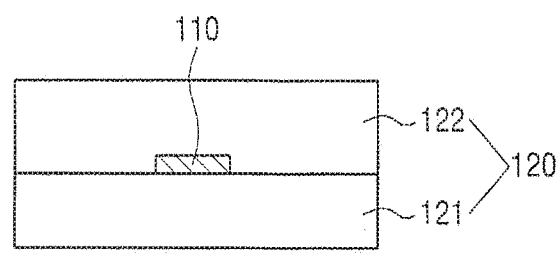

As illustrated in FIG. 2C, a second coverlay 122 may be laminated on the signal transmission member 110 and the first coverlay 121. For example, the second coverlay 122 may be configured of the same material as the first coverlay 121 or a different material from the first coverlay 121. In this example, the second coverlay 122 may be configured of any material having an insulating property. The second coverlay 122 may form the insulating part 120 together with the first coverlay 121.

The signal transmission member 110 may be covered with the first and second coverlays 121 and 122 laminated on a top and a bottom of the signal transmission member 110 and accordingly, the signal transmission member 110 may be buried within the inside of the insulating part 120.

Figure 2D:
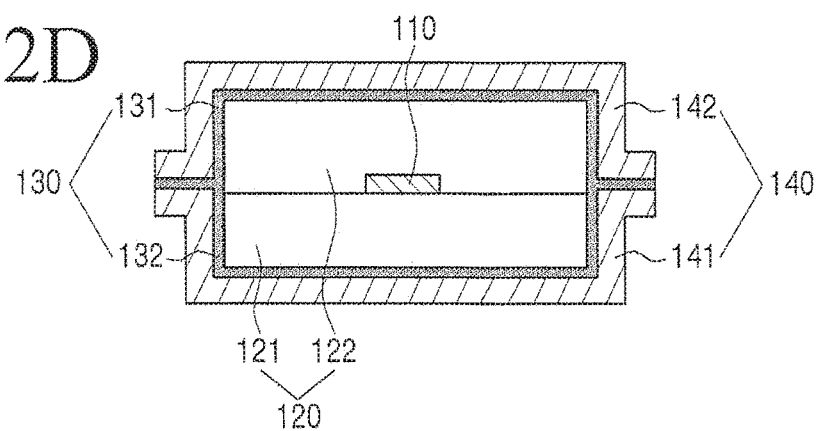

As illustrated in FIG. 2D, first and second shield films 141 and 142 of which conductive adhesives 131 and 132 are applied to one surfaces may be disposed on a top and a bottom of the insulating part 120 and then pressed to completely cover the insulating part 120. Accordingly, the conductive adhesives 131 and 132 may form the conductive adhesive layer 130 having a shielding function and the first and second shield films 141 and 142 may form the outer skin part 140.

The flexible flat cable 100 according to an example embodiment may be manufactured through the process as illustrated in FIGS. 2A to 2D.

Figure 3:
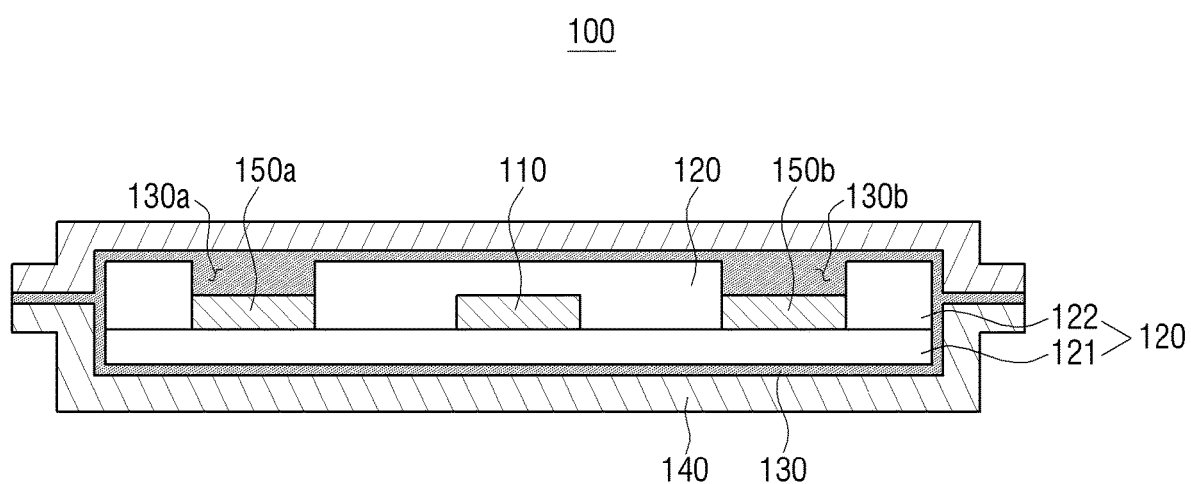
FIG. 3 is a cross-sectional diagram illustrating another example flexible flat cable including a pair of ground members added to the flexible flat cable of FIG. 1 according to an example embodiment.

FIG. 3 is a cross-sectional diagram illustrating another example flexible flat cable wherein a pair of ground members are added to the flexible flat cable of FIG. 1 according to an example embodiment.

Referring to FIG. 3, the flexible flat cable 100 according to an example embodiment may include a pair of ground members 150a and 150b which are disposed at intervals in both sides of the signal transmission member 110.

A conductive adhesive layer 130 may include first and second conductive adhesive blocks 130a and 130b which protrude toward the inside of the insulating part 120 and are electrically coupled to the pair of ground members 150a and 150b. The conductive adhesive layer 130 may completely cover the signal transmission member 110 to shield an external signal transmitted to the signal transmission member 110. Accordingly, interference of a transmission signal of the signal transmission member 110 with an external signal may not occur and thus product reliability may be ensured.

The pair of ground members 150a and 150b may be configured of a conductive metal such as copper like the material for the signal transmission member 110.

The signal transmission member 110 may be configured of a strip line. A cross section of each of the pair of the ground members 150a and 150b may have the same shape as that of the signal transmission member 110. However, this is not limited thereto and a thickness and a width of the ground member may be variously set.

FIGS. 4A, 4B, 4C, 4D, 4E and 4F are diagrams illustrating an example manufacturing process of the flexible flat cable of FIG. 3 according to an example embodiment.

Figure 4A:
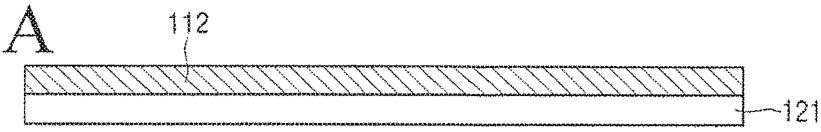
FIGS. 4A, 4B, 4C, 4D, 4E and 4F are diagrams illustrating an example manufacturing process of the flexible flat cable of FIG. 3 according to an example embodiment.

Referring to FIG. 4A, the first coverlay 121 having a copper thin film layer 112 formed in one surface may be prepared. For example, the first coverlay 121 may be configured of an insulator.

Figure 4B:
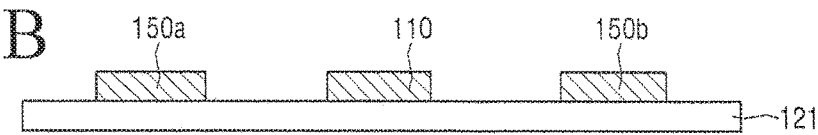

As illustrated in FIG. 4B, portions of the copper thin film layer 112 may be etched to form the signal transmission member 110 configured to transmit a signal and the pair of the ground members 150a and 150b.

Figure 4C:
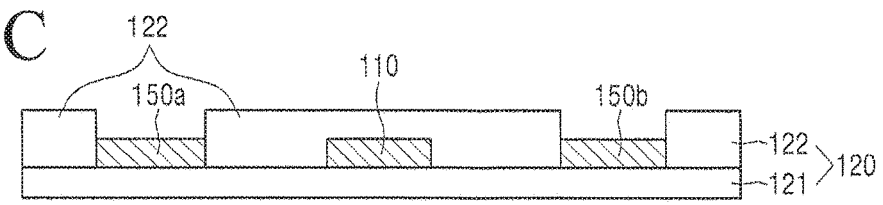

As illustrated in FIG. 4C, a second coverlay 122 having grooves which are formed by punching portions of the second coverlay 122 corresponding to the pair of ground members 150a and 150b may be prepared. For example, the second coverlay 122 having the grooves be laminated on the first coverlay 121. In another example, the second coverlay 122 may be laminated on the first coverlay 121 and then the portions of the second coverlay 122 corresponding to the pair of the ground members 150a and 150b may be punched. The second coverlay 122 may be configured of the same material as the first coverlay 121 or a different material from the first coverlay 121. In this example, the second coverlay 122 may be configured of any material having an insulating property. The second coverlay 122 may form the insulating part 120 together with the first coverlay 121.

The signal transmission member 110 may be covered with the first and second coverlays 121 and 122 laminated on the top and bottom of the signal transmission member 110 and accordingly, the signal transmission member 110 may be buried within the inside of the insulating part 120 as illustrated in FIG. 3.

Figure 4D:
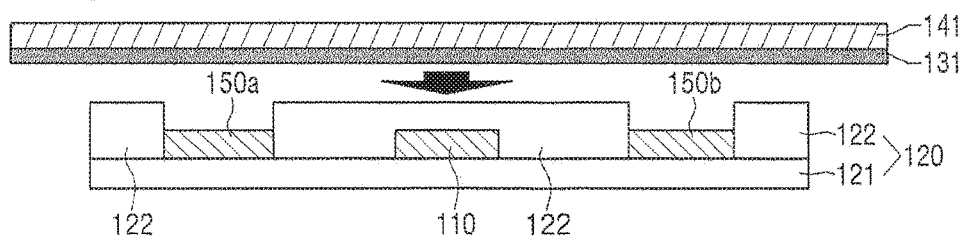
Figure 4E:
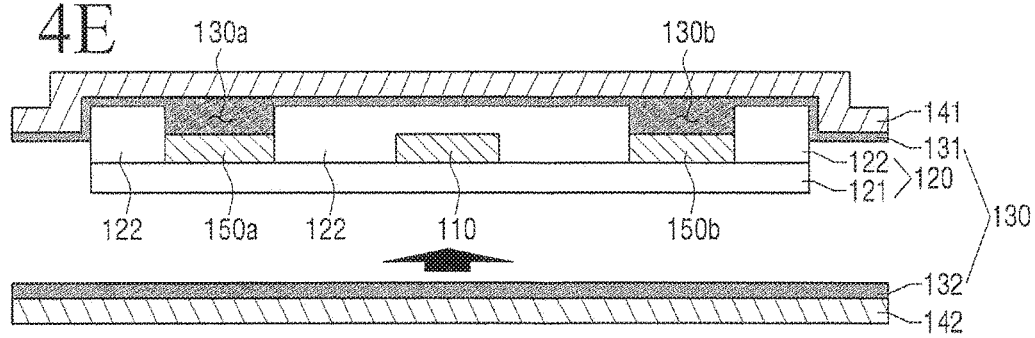
Figure 4F:
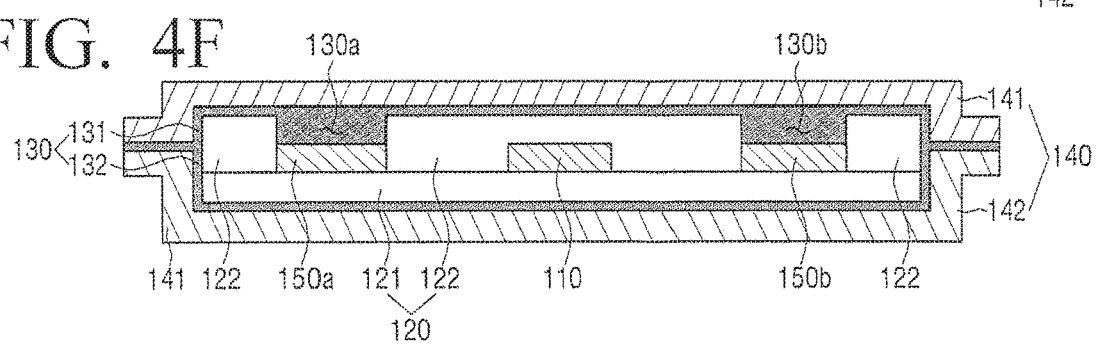

As illustrated in FIG. 4D, a first shield film 141 to which a conductive adhesive 131 is applied may be disposed on the top of the second coverlay 122 and then pressed. For example, the conductive adhesive 131 may be filled within the grooves concaved toward the inside of the insulating part to form the conductive adhesive blocks 130a and 130b electrically coupled to the pair of ground members 150a and 150b as illustrated in FIG. 4E. Then, as illustrated in FIG. 4E, a second shield film 142 to which a conductive adhesive 132 is applied may be pressed in the bottom of the first coverlay 121 to surround the first coverlay 121. Accordingly, as illustrated in FIG. 4F, the signal transmission member 110 may be covered with the first and second coverlays 121 and 122 and the conductive adhesives 131 and 132 applied to the first and second shield films 141 and 142 may form the conductive adhesive layer 130 having a shield function.

The signal transmission member 110 may be covered with the conductive adhesive layer 130 and the pair of ground members 150a and 150b to shield noise transferred from the outside.

The flexible flat cable 100 according to an example embodiment may be manufactured through the process as illustrated in FIGS. 4A to 4F.

Figure 5:
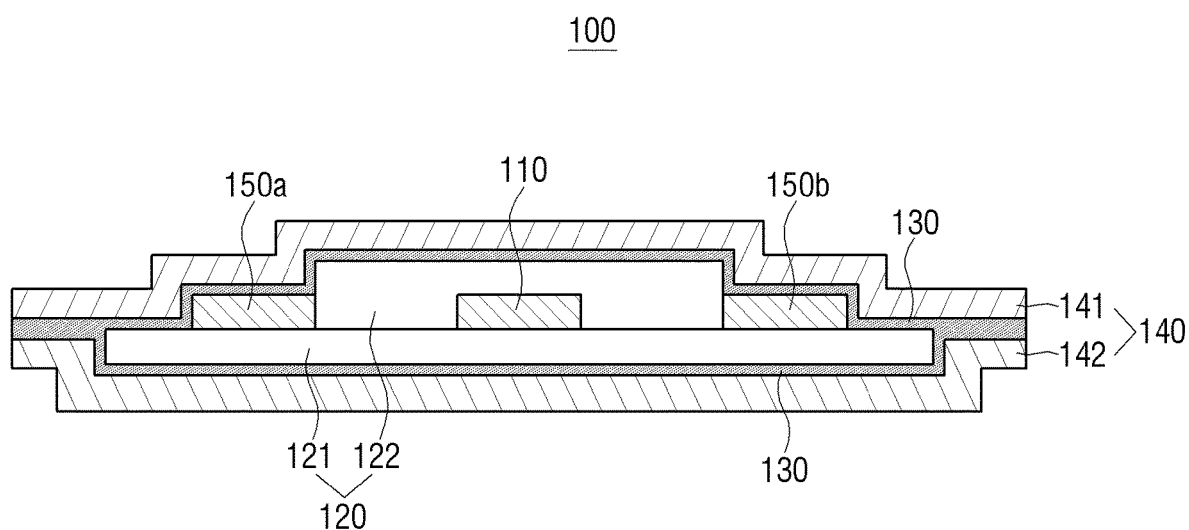
FIG. 5 is a cross-sectional diagram illustrating a modified example of a flexible flat cable wherein an insulating part disposed in a side of a ground member of the flexible flat cable of FIG. 3 is removed according to an example embodiment.

FIG. 5 is a cross-sectional diagram illustrating a modified example of a flexible flat cable wherein an insulating part disposed in a side of a ground member of the flexible flat cable of FIG. 3 is removed according to an example embodiment.

Referring to FIG. 5, an insulating part 120 of the flexible flat cable 100 according to an example embodiment may include a first coverlay 121 and a second coverlay 122.

The pair of ground members 150a and 150b may be located on the first coverlay 121 of the insulating part 120 and may be disposed on both sides of the second coverlay 120. The signal transmission member 110 may be disposed in the inside of the second coverlay 122.

The outer skin part 140 may cover the first and second coverlays 121 and 122 and the pair of ground members 150a and 150b. The outer skin part 140 may be configured of a deformable material such as a rubber material. The outer skin part 140 may be formed in a plate-like shape to be easily deformed and thus the outer skin part 140 may also cover an uneven shape as illustrated in FIG. 5.

The conductive adhesive layer 130 is applied to one surface of the outer skin part 140 and the conductive adhesive layer 130 may be electrically coupled to the pair of the ground members 150a and 150b.

Accordingly, the conductive adhesive layer 130 may shield the signal transmission member 110 and may block the crosstalk between a signal transmitted to the signal transmission member 110 and an external signal.

For example, the outer skin part 140 may be configured of a conductive film according to an amount of the conductive material contained in the conductive adhesive. The signal transmission member 110 may be configured of a strip line.

FIGS. 6A, 6B, 6C, 6D, 6E and 6F are diagrams illustrating an example manufacturing process of the flexible flat cable of FIG. 5 according to an example embodiment.

A manufacturing process of the flexible flat cable 100 according to an example embodiment will be described with reference to FIGS. 6A and 6B.

Figure 6A:
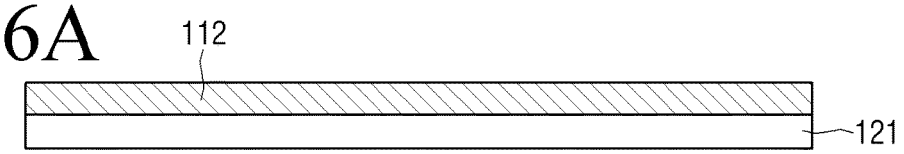
FIGS. 6A, 6B, 6C, 6D, 6E and 6F are diagrams illustrating an example manufacturing process of the flexible flat cable of FIG. 5 according to an example embodiment.
Figure 6B:
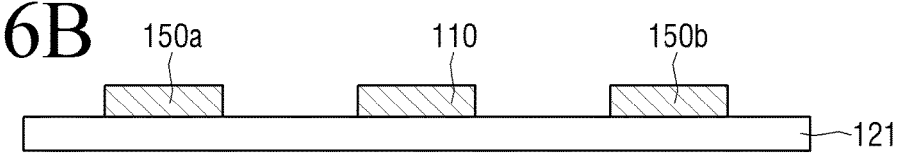

Operations illustrated in FIGS. 6A and 6B may be the same as those illustrated in FIGS. 4A and 4B and thus detailed description thereof will not be repeated.

Figure 6C:
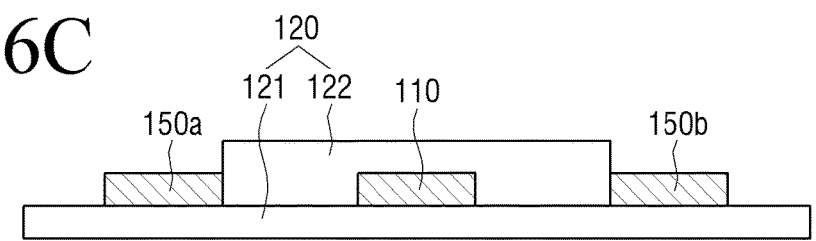

Referring to FIG. 6C, for example, the second coverlay 122 may be punched so that only a portion of the second coverlay 122 which covers the signal transmission member 110 may remain. The punched second coverlay 122 may be laminated on the first coverlay 121. In another example, the second coverlay 122 may be laminated on the first coverlay 121 and then punched. The second coverlay 122 may be configured of the same material as the first coverlay 121. For example, the second coverlay 122 may be configured of any material having an insulating property. In this example, the second coverlay 122 may form the insulating part 120 together with the first coverlay 121.

The signal transmission member 110 may be covered with the first and second coverlays 121 and 122 and thus the signal transmission member 110 may be buried within the insulating part 120.

Figure 6D:
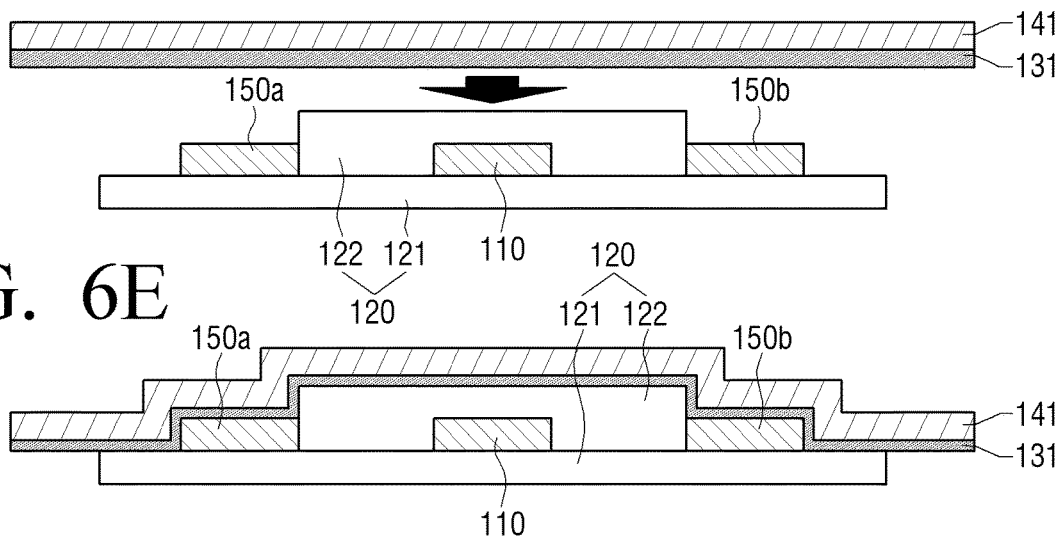

As illustrated in FIG. 6D, the first shield film 141 to which the conductive adhesive 131 is applied may be laminated on top surfaces of the second coverlay 122 and the pair of ground members 150a and 150b and then pressed. For example, the first shield film 141 may be deformed according to a shape formed through the first and second coverlays 121 and 122 and the pair of ground members 150a and 150b and the first shield film 141 may be coupled to the first and second coverlays 121 and 122 and the pair of ground members 150a and 150b through the conductive adhesive 131.

Figure 6E:
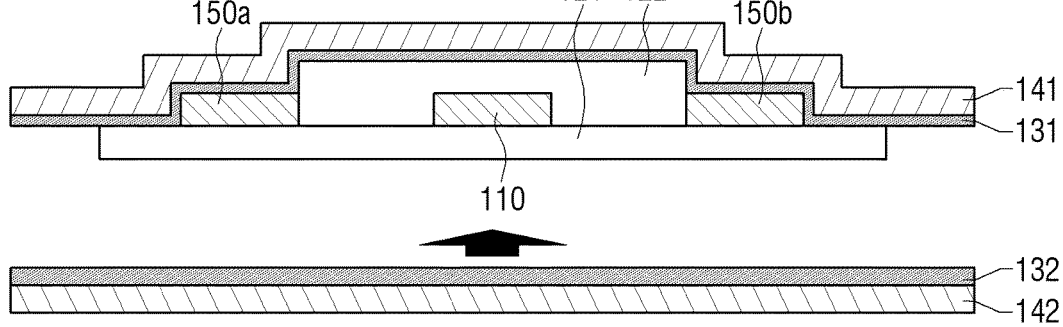

As illustrated in FIG. 6E, the second shield film 142 to which the conductive adhesive 132 is applied may be pressed in the bottom of the first coverlay 121 to surround the first coverlay 121. Accordingly, the conductive adhesives 131 and 132 applied to the first and second shield films 141 and 142 may form the conductive adhesive layer 130.

Figure 6F:
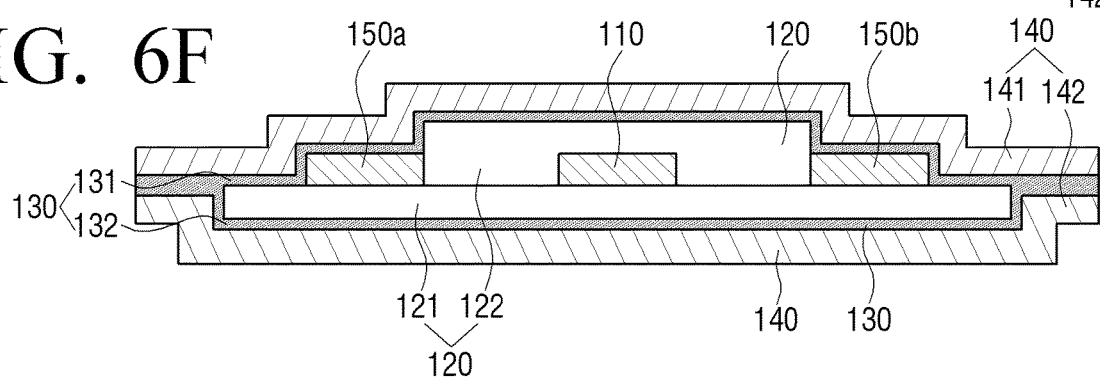

In the flexible flat cable 100 according to an example embodiment manufactured as illustrated in FIG. 6F, the signal transmission member 110 may be covered with the first and second coverlays 121 and 122 and the first and second coverlays 121 and 122 may be further covered with the conductive adhesive layer 130 and the pair of ground members 150a and 150b and thus noise transferred from the outside may be shielded.

Figure 7:
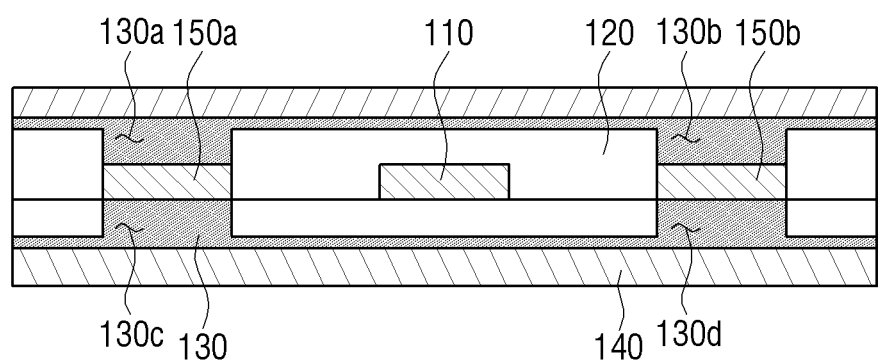
FIG. 7 is a cross-sectional diagram illustrating another example flexible flat cable wherein top surfaces and bottom surfaces of a pair of ground members of the flexible flat cable of FIG. 3 are coupled to a conductive adhesive layer according to an example embodiment.

FIG. 7 is a cross-sectional diagram illustrating another example flexible flat cable wherein top surfaces and bottom surfaces of a pair of ground members of the flexible flat cable of FIG. 3 are coupled to a conductive adhesive layer according to an example embodiment.

Referring to FIG. 7, a conductive adhesive layer 130 may further include third and fourth conductive adhesive blocks 130c and 130d which protrude toward the inside of the insulating part 120 and are electrically coupled to the pair of ground members 150a and 150b in addition to the first and second conductive adhesive blocks 130a and 130b. The conductive adhesive layer 130 may completely cover the signal transmission member 110 in an upper side and a lower side thereof and thus an external signal transmitted to the signal transmission member 110 may be shielded. Accordingly, the manufacturing process of the flexible flat cable 100 may be complicated, but the signal crosstalk probability may be further reduced in a transmission signal of the signal transmission member 110 than in the signal transmission signal of the signal transmission member 110 of FIG. 3.

FIGS. 8A, 8B, 8C, 8D, 8E and 8F are diagrams illustrating an example manufacturing process of the flexible flat cable of FIG. 7 according to an example embodiment.

Figure 8A:
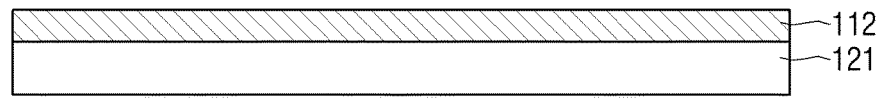
FIGS. 8A, 8B, 8C, 8D, 8E and 8F are diagrams illustrating an example manufacturing process of the flexible flat cable of FIG. 7 according to an example embodiment.

Referring to FIG. 8A, the first coverlay 121 having the copper thin film layer 112 formed in one surface may be prepared. For example, the first coverlay 121 may be configured of an insulator.

Figure 8B:
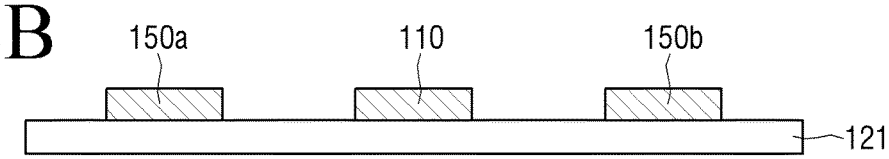

As illustrated in FIG. 8B, portions of the copper thin film layer 112 may be etched to form the signal transmission member 110 configured to transmit a signal and the pair of ground members 150a and 150b.

Figure 8C:
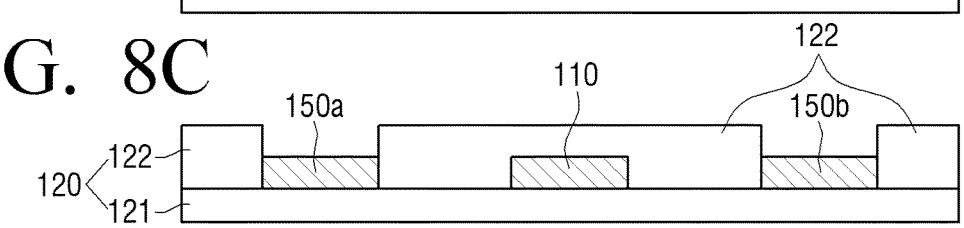

As illustrated in FIG. 8C, portions of the second coverlay 122 corresponding to the pair of ground members 150a and 150b may be punched so that grooves may be formed in the second coverlay 122. The second coverlay 122 having the grooves may be laminated on the first coverlay 121. In another example, the second coverlay 122 may be laminated on the first coverlay 121 and then punched. The second coverlay 122 may be configured of the same material as the first coverlay 121 or a different material from the first coverlay 121. For example, the second coverlay 122 may be configured of any material having an insulating property. In this example, the second coverlay 122 may form the insulating part 120 together with the first coverlay 121.

The signal transmission member 110 may be covered with the first and second coverlays 121 and 122 laminated on the top and bottom thereof and thus the signal transmission member 110 may be buried within the insulating part 120 as illustrated in FIG. 8C.

Figure 8D:
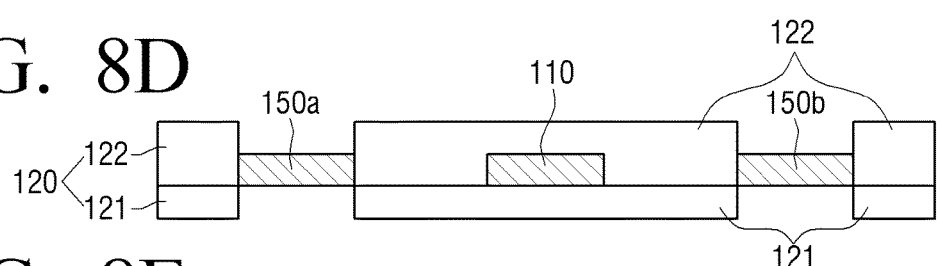

As illustrated in FIG. 8D, grooves may be formed in the first coverlay 121 by punching portions of the first coverlay 121 corresponding to the pair of ground members 150a and 150b.

Figure 8E:
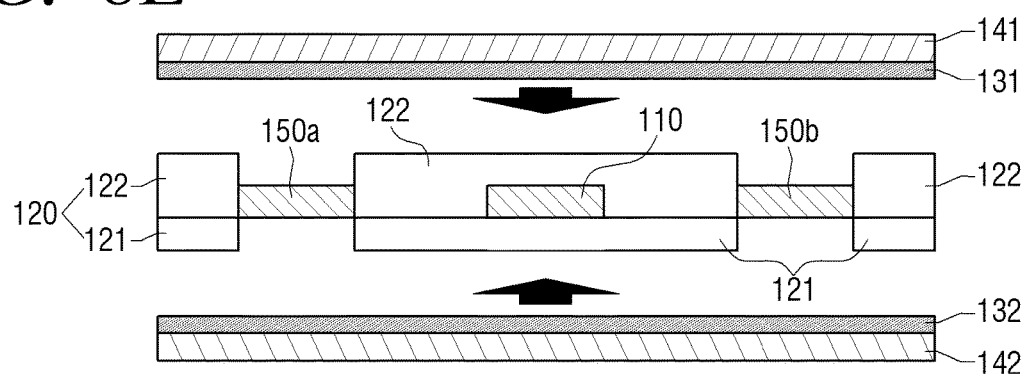

As illustrated in FIG. 8E, a first shield film 141 to which a conductive adhesive 131 is applied may be laminated on the top of the second coverlay (insulating layer) 122 and then pressed. For example, the conductive adhesive 131 may be filled within grooves which are concaved toward the inner side of the insulating part 120 to form the first and second conductive adhesive blocks 130a and 130b (e.g., see FIG. 8F) electrically coupled to the pair of ground members 150a and 150b. A second shield film 142 to which a conductive adhesive 132 is applied may be pressed in the bottom of the first coverlay (insulating layer) 121 to surround the first coverlay (insulating layer) 121. As used herein, the term "coverlay" refers to an insulating layer(s). The conductive adhesive 132 may be filled within grooves which are concaved toward the inner side of the insulating part to form the third and fourth conductive adhesive blocks 130c and 130d electrically coupled to the pair of ground members 150a and 150b (e.g., see FIGS. 6F, 7, and 8F).

Figure 8F:
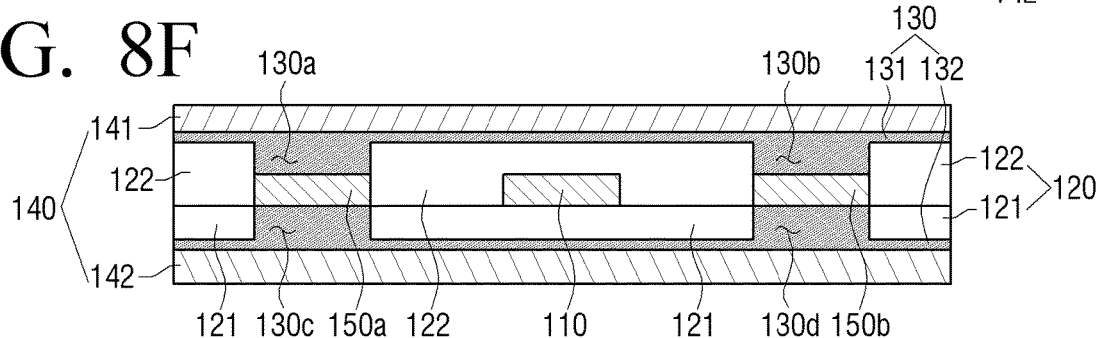

The conductive adhesives 131 and 132 may form the conductive adhesive layer 130 through the above-described process as illustrated in FIG. 8F and the signal transmission member 110 may be covered with the conductive adhesive layer 130 and the pair of ground members 150a and 150b and thus external noise may be shielded.

The flexible flat cable 100 according to an example embodiment may be manufactured through the process as illustrated in FIGS. 8A to 8F.

Figure 9:
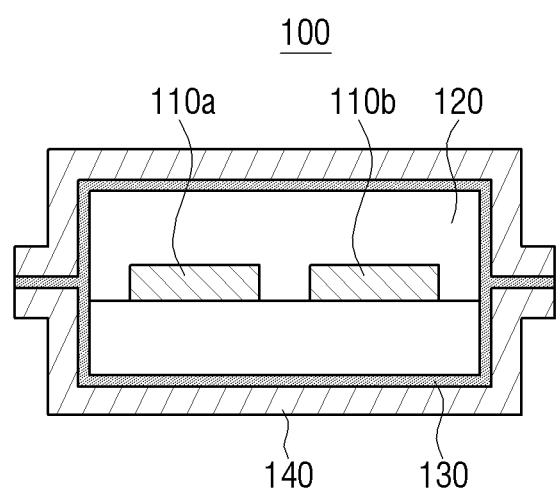
FIG. 9 is a cross-sectional diagram illustrating an example of a flexible flat cable having a pair of signal transmission lines according to an example embodiment.
Figure 10:
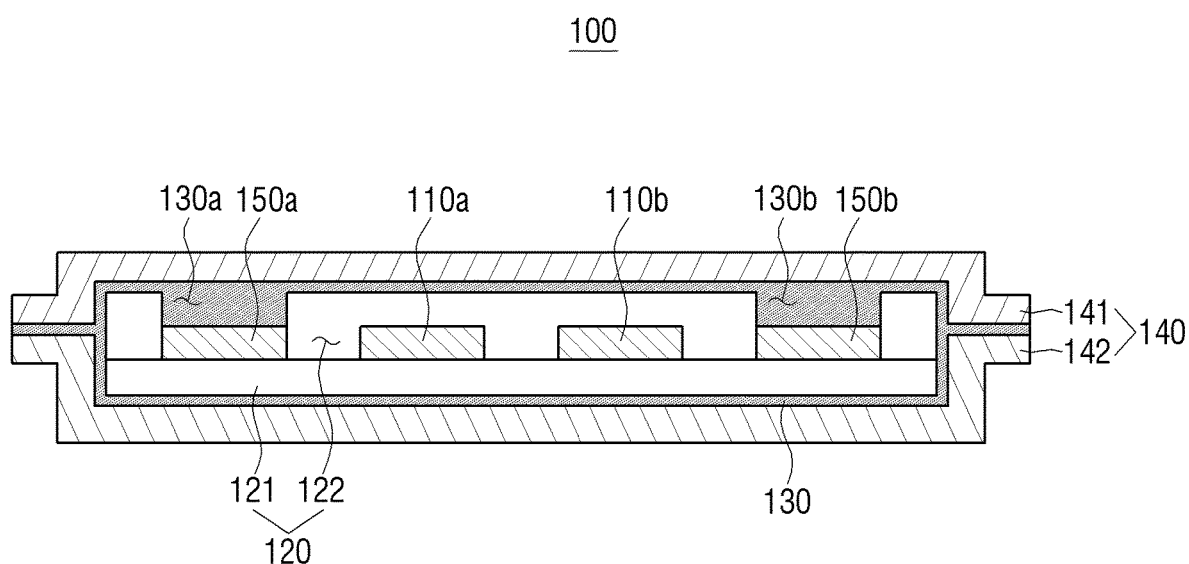
FIG. 10 is a cross-sectional diagram illustrating another example of a flexible flat cable wherein a signal transmission line is added to the flexible flat cable of FIG. 3 according to an example embodiment.
Figure 11:
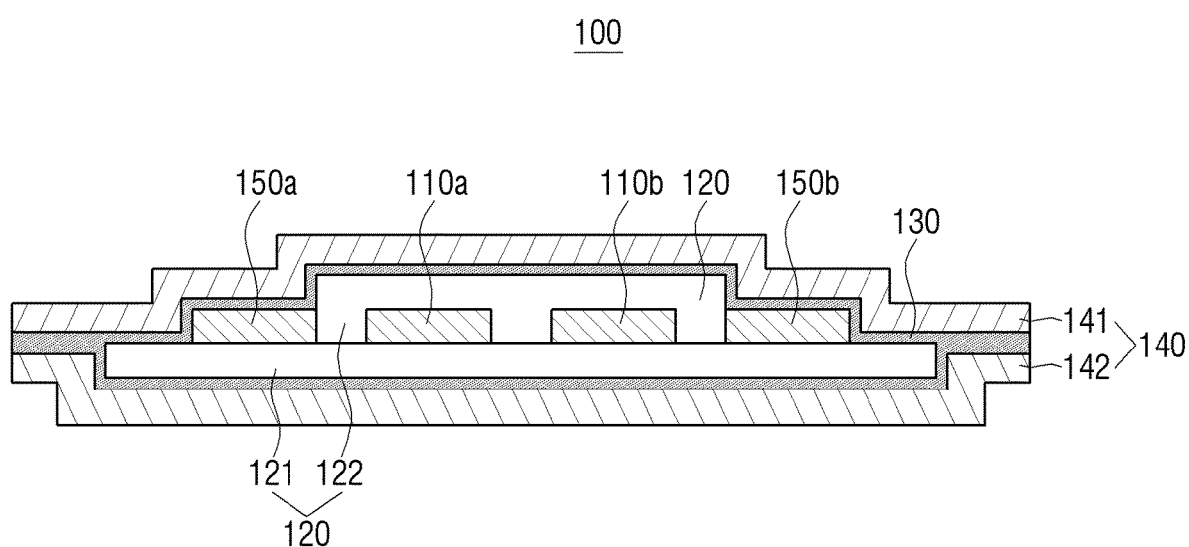
FIG. 11 is a cross-sectional diagram illustrating a modified example of a flexible flat cable wherein a signal transmission line is added to the flexible flat cable of FIG. 5 according to an example embodiment.
Figure 12:
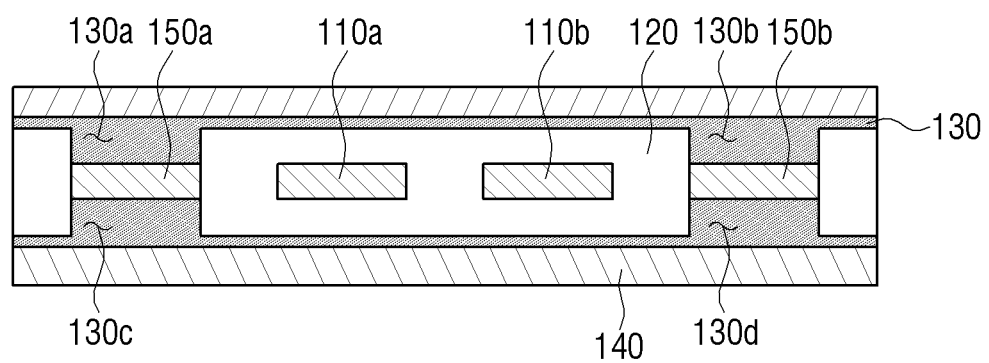
FIG. 12 is a cross-sectional diagram illustrating another example of a flexible flat cable wherein a signal transmission line is added to the flexible flat cable of FIG. 7 according to an example embodiment.

FIG. 9 is a cross-sectional diagram illustrating an example wherein a pair of signal transmission lines are provided according to an example embodiment. FIG. 10 is a cross-sectional diagram illustrating another example of a flexible flat cable wherein a signal transmission line is added to the flexible flat cable of FIG. 3 according to an example embodiment. FIG. 11 is a cross-sectional diagram illustrating a modified example of a flexible flat cable wherein a signal transmission line is added to the flexible flat cable of FIG. 5 according to an example embodiment. FIG. 12 is a cross-sectional diagram illustrating another example of a flexible flat cable wherein a signal transmission line is added to the flexible flat cable of FIG. 7 according to an example embodiment.

The flexible flat cable 100 of FIG. 9 may include a signal transmission member including a pair of signal transmission lines 110a and 110b unlike the flexible flat cable 100 of FIG. 1. Accordingly, the flexible cable 100 may transmit signals having different phases through the pair of signal transmission lines 110a and 110b. Interference and noise between signals may be reduced through the differential signal transmission lines 110a and 110b having the different phases from each other. A difference in magnitudes between signals transmitted to the differential signal transmission lines 110a and 110b may be a signal to be transmitted through the signal transmission member. For example, amounts of noise interfered between lines close to each other may be similar to each other and the noise interfered through the signal difference between the differential signal transmission lines 110a and 110b may be offset. Accordingly, the signal transmission through the differential signal transmission lines 110a and 110b may be less vulnerable to the external noise interference than the signal transmission through a transmission line having a single terminal. The flexible flat cable may further accomplish electromagnetic shield by covering the signal transmission member through the conductive adhesive layer 130, the outer skin part 140 configured of a conductive film, and the ground member 150.

The differential signal transmission lines 110a and 110b may further reduce external noise than the signal transmission line having the single terminal.

The flexible flat cables 100 illustrated in FIGS. 10 to 12 may include the signal transmission member configured of the pair of signal transmission lines 110a and 110b as compared with the flexible flat cables 100 of FIGS. 3, 5, and 7. The additional configuration and the effect of the signal transmission line 110b may be the same as described above.

Figure 13:
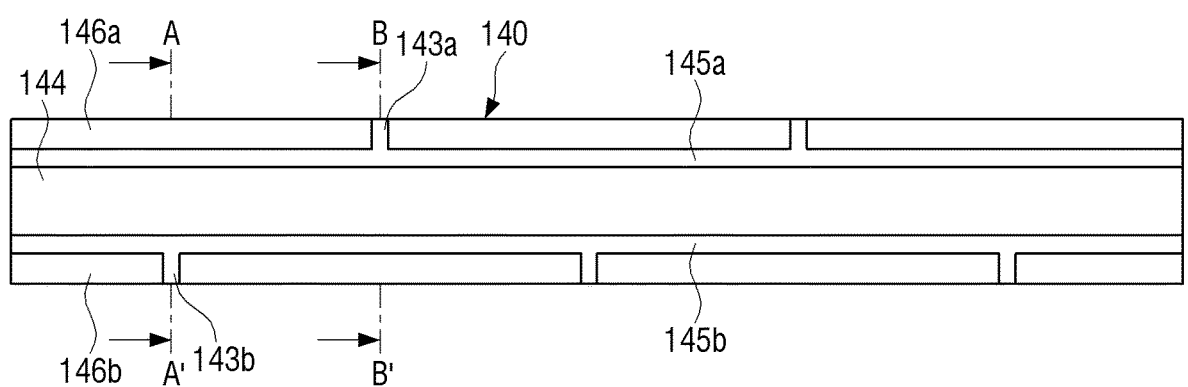
FIG. 13 is a top view illustrating the example flexible flat cable of FIG. 11.
Figure 14:
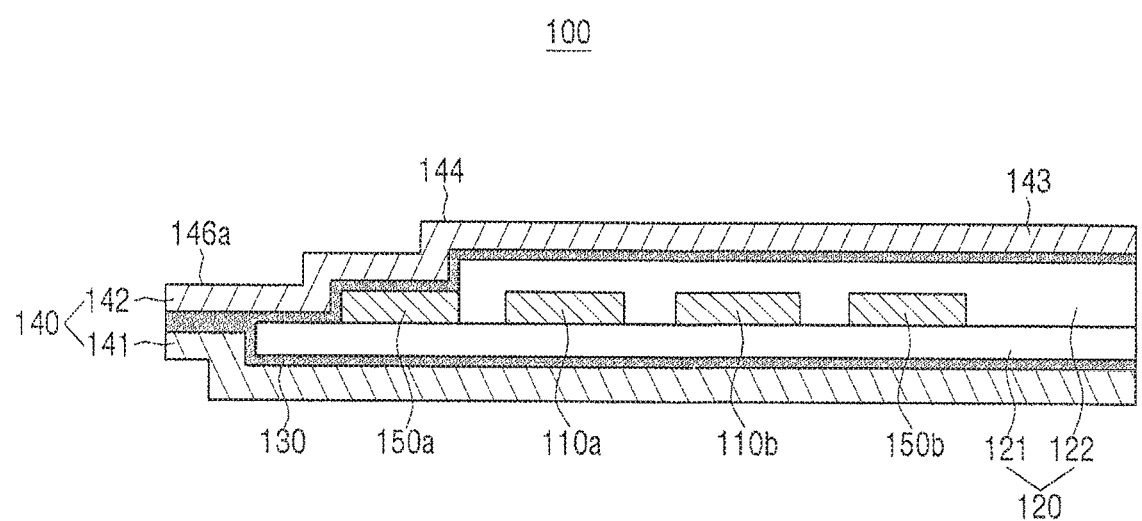
FIGS. 14 and 15 are cross-sectional diagrams illustrating the flexible flat cable taken along lines A-A' and B-B' of FIG. 13.
Figure 15:
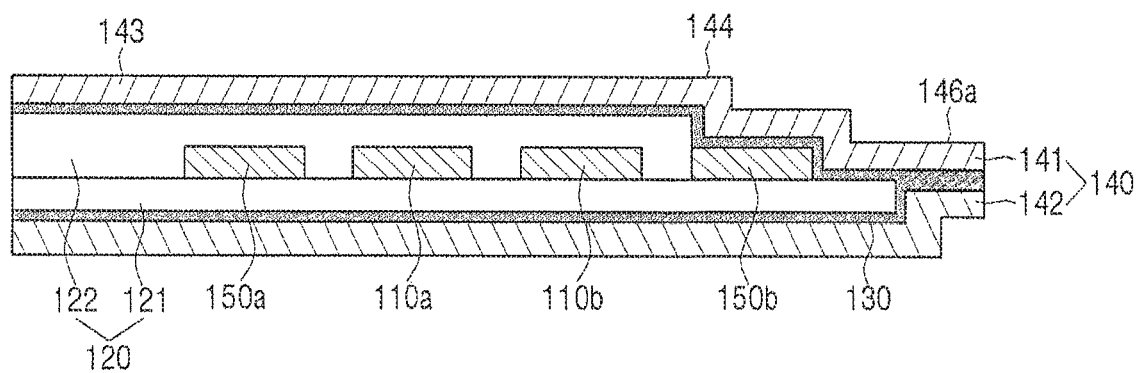

FIG. 13 is a top view illustrating the flexible flat cable of FIG. 11 and FIGS. 14 and 15 are cross-sectional diagrams illustrating the flexible flat cable taken along lines A-A' and B-B' of FIG. 13.

Referring to FIG. 13, the outer skin part 140 (including portions 146a, 146b) in the flexible flat cable 100 may be configured of a deformable material and may be formed to have a form corresponding to shapes of members disposed within the outer skin part 140. For example, the outer skin part 140 may protrude in a form corresponding to a shape of the second coverlay (insulating layer) (see 122 of FIG. 11) in a central portion 144 of the flexible flat cable 100 and the outer skin part 140 may have a bending portions 145a and 145b formed to correspond to heights of the pair of ground members (see e.g., 150a and 150b of FIG. 11) in a width direction in the central portion 144. Conductive adhesive layer 130 and the outer skin part 140 may be formed as shown in FIGS. 11 and 14-15. And protruding bridges 143a and 143b may be formed as shown in FIG. 13.

Referring to FIGS. 14 and 15, it can be seen that the bridge 143a (FIG. 15) or 143b (FIG. 14) denotes a portion of the flexible flat cable that any one of the pair of ground members 150a (FIG. 14) and 150b (FIG. 15) is buried within the second coverlay 122. In response to a plurality of flexible flat cables being simultaneously manufactured, coverlays of flexible flat cables for manufacturing the plurality of flexible flat cables may be coupled. A process on the single-layered first and second coverlays 121 and 122 may be performed in a fixed position and the additional bridge (143a and 143b)

may be formed in response to the operation being performed by ensuring the more accurate position.

It has been described in FIG. 13 that the bridges 143a and 143b are disposed in a zig-zag form, but the bridges 143a and 143b may be disposed to face each other on the basis of the signal transmission line.

Figure 16:
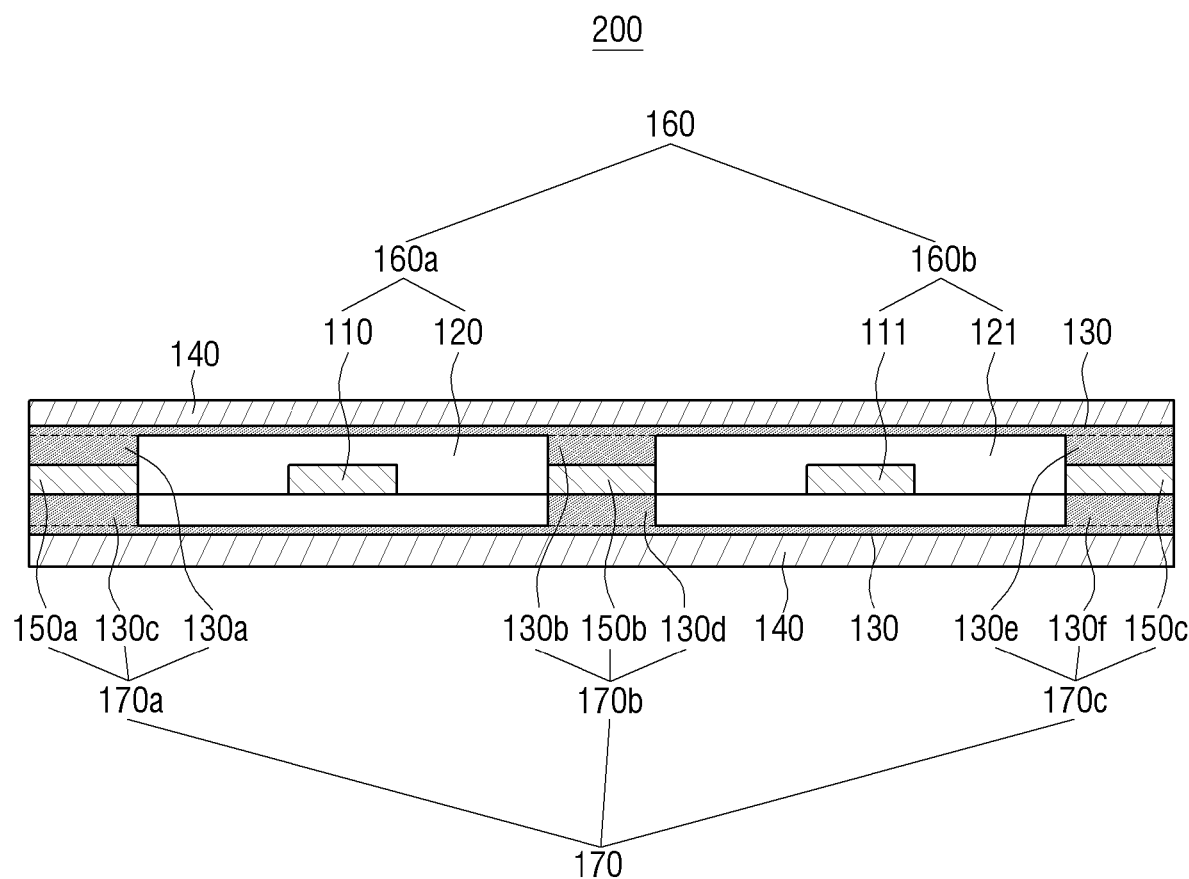
FIG. 16 is a cross-sectional diagram illustrating another example of a flexible flat cable wherein a signal transmission line is added to the flexible flat cable of FIG. 7 according to an example embodiment.
Figure 17:
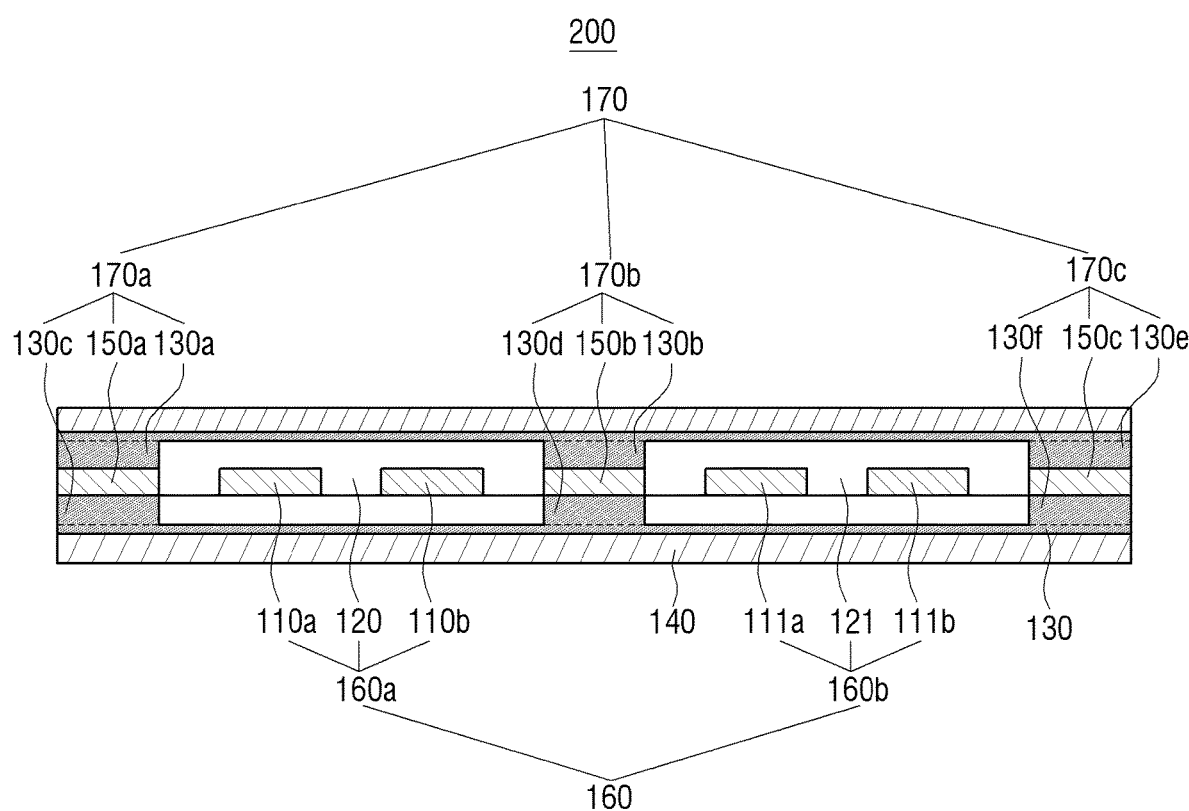
FIG. 17 is a cross-sectional diagram illustrating another example of a flexible flat cable wherein a signal transmission line is added to the flexible flat cable of FIG. 16 according to an example embodiment.

FIG. 16 is a cross-sectional diagram illustrating another example of a flexible flat cable wherein a signal transmission part is added to the flexible flat cable of FIG. 7 according to an example embodiment and FIG. 17 is a cross-sectional diagram illustrating another example of a flexible flat cable wherein a signal transmission line is added to the flexible flat cable of FIG. 16 according to an example embodiment.

Referring to FIG. 16, a flexible flat cable 200 may further include a second signal transmission part 160b in addition to a first signal transmission part 160a. A signal transmission part 160 may include a plurality of signal transmission parts 160a and 160b. Separate signals may be transmitted through the signal transmission parts 160a and 160b. Accordingly, a plurality of signals may be simultaneously transmitted through the plurality of signal transmission parts. As illustrated in FIG. 16, the flexible flat cable 200 may include the signal transmission part 160 and a ground part 170.

The signal transmission part 160 may have signal transmission lines 110 and 111 buried within insulating members 120 and 121. The ground part 170 may include a plurality of ground parts 170a, 170b, and 170c and each of the ground parts 170a, 170b, and 170c may include a pair of conductive adhesive blocks 130a and 130c, 130b and 130d, and 130e and 130f and a ground member 150a, 150b, and 150c.

The first and second ground parts 170a and 170b and the conductive adhesive layer 130 may be coupled to the first to fourth conductive adhesive blocks 130a, 130b, 130c, and 130d to cover the first signal transmission part 160a. Like the first signal transmission part 160a, the second signal transmission part 160b may be covered with the third to sixth conductive adhesive blocks 130c, 130d, 130e, and 130f, the second to third ground parts 170b and 170c, and the conductive adhesive layer 130. The conductive adhesive layer 130 may be applied to the outer skin part 140 and thus the outer skin part 140 may entirely cover the flexible flat cable.

Referring to FIG. 17, the first and second signal transmission parts 160a and 160b may include a pair of signal transmission lines 110a and 110b and 111a and 111b to transmit a differential signal unlike the flexible flat cable 200 of FIG. 16. Accordingly, signal transmission characteristics in the flexible flat cable 200 may be improved as compared with the flexible flat cable 200 including the single transmission lines 110 and 111 as illustrated in FIG. 16.

Figure 18:
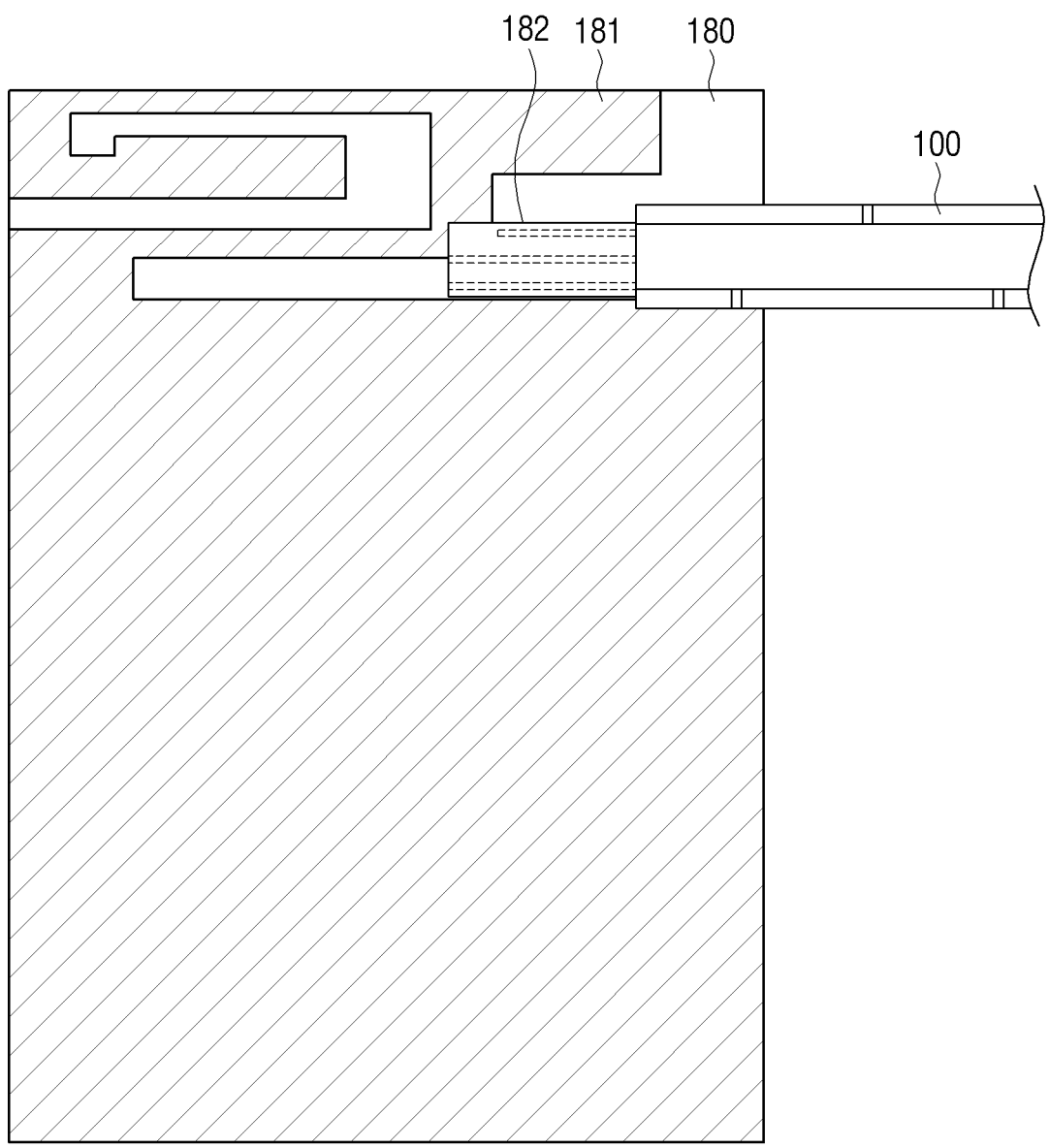
FIG. 18 is a diagram illustrating an example flexible flat cable wherein a conductive pattern is formed in an end portion according to an example embodiment.
Figure 19:
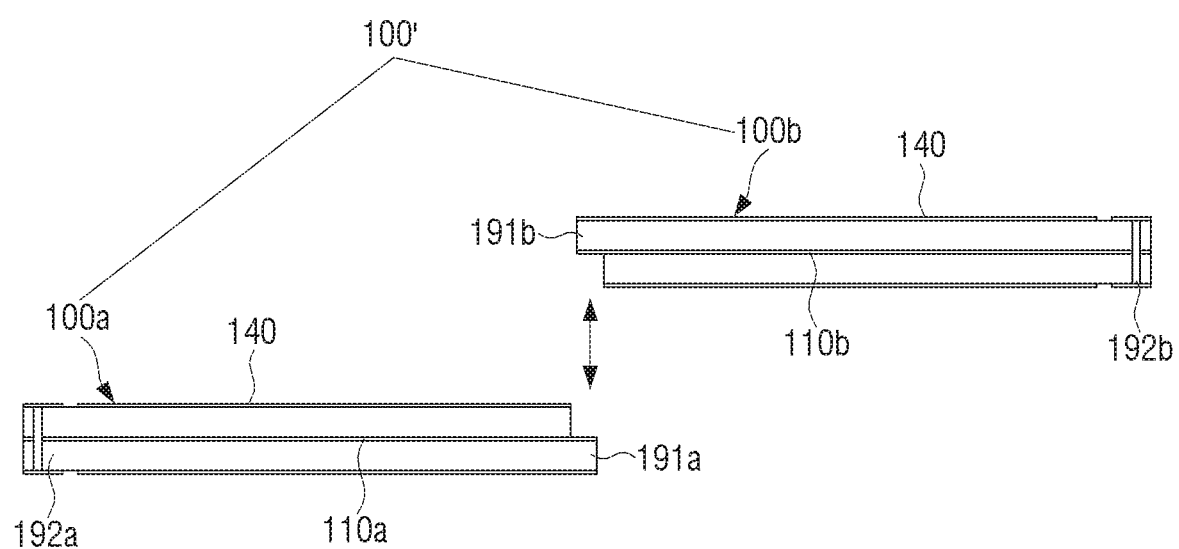
FIG. 19 is a diagram illustrating an example flexible flat cable wherein a connection terminal is formed in an end portion according to an example embodiment.
Figure 20:
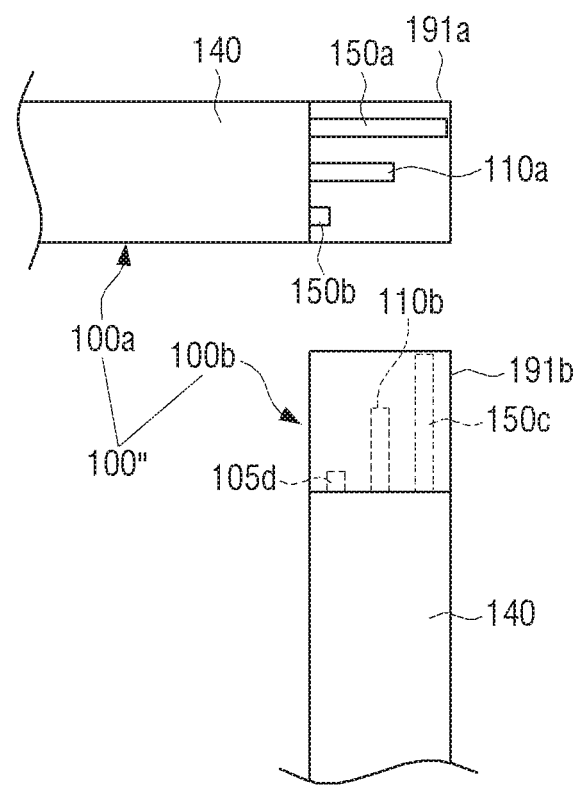
FIG. 20 is a plan view illustrating a modified example of the connection terminal of FIG. 19.

FIG. 18 is a diagram illustrating an example flexible flat cable wherein a conductive pattern is formed in an end portion according to an example embodiment. FIG. 19 is a diagram illustrating an example flexible flat cable wherein a connection terminal is formed in an end portion according to an example embodiment. FIG. 20 is a plan view illustrating a modified example of the connection terminal of FIG. 19.

Referring to FIG. 18, the flexible flat cable 100 according to an example embodiment may be manufactured through a FPCB (flexible PCB) process or FFC (flat flexible cable) process and thus a connection part 182 that the outer skin part, that the signal transmission member is buried, is removed and a circuit board 180 may be integrally manufactured. The circuit board 180 may include a conductive pattern 181 integrally formed with the connection part 182. The circuit board 180 including the conductive pattern 181 embodied with an antenna or various conductive patterns 181 may be integrally formed in one end of the flexible flat panel 100.

In the manufacturing process of the flexible flat cable 100, a copper thin film layer is applied to the first coverlay 121 (insulating layer) and then etched to form the signal transmission member 110, the ground members 150a and 150b, and the conductive pattern 181. The circuit board 180 including the conductive pattern 181 may be formed in the end portion of the flexible flat cable 100 by applying the second coverlay 122 (insulating layer) only to a portion of the flexible flat cable 100 including the signal transmission member 110 and the ground members 150a and 150b.

An extension method of flexible flat cables 100a and 100b will be described with reference to FIG. 19. A first flexible flat cable 100a may include a first external terminal 192a to be coupled to an external apparatus in one end of the first flexible flat cable 100a and a first connection terminal 191a to be coupled to another flexible flat cable 100b in the other end of the first flexible flat cable 100a. Similarly, a second flexible flat cable 100b may include a second external terminal 192b in one end of the second flexible flat cable 100b and a second connection terminal 191b in the other end of the second flexible flat cable 100b.

The first and second external terminals 192a and 192b (e.g., see FIG. 19) may be coupled to the first and second signal transmission members 110a and 110b (e.g., see FIGS. 15, 17, 19, 20) and the first and second signal transmission members 110a and 110b may be exposed in the first and second connection terminals 191a and 191b.

The first and second connection terminals 191a and 191b may electrically couple the first and second signal transmission members 110a and 110b to extend a cable 100'.

The first and second signal transmission lines 110a and 110b may be electrically coupled through a reflow process or a surface mount technology.

Referring to FIG. 20, the first and second ground members 150a and 150b disposed in both sides of the first signal transmission member 110a exposed in the first connection terminal 191a may be disposed in different lengths. The lengths of the first ground member 150a, the first signal transmission member 110a, and the second ground member 150b exposed in the first connection terminal 191a may be sequentially reduced.

The second signal transmission member 110b and the third and fourth ground members 150c and 150d exposed in the second connection terminal 191b may be disposed in different lengths to correspond to the first connection terminal 191a.

A cable 100" (including 100a, 100b) may form a cable bent to have a fixed angle by overlapping the first and second connection terminals 191a and 191b. For example, the first signal transmission member 110a and the first and second ground members 150a and 150b may be disposed to be in contact with the second signal transmission member 110b and the third and fourth ground members 150c and 150d and may be electrically coupled to the second signal transmission member 110b and the third and fourth ground members 150c and 150d.

It has been described in FIG. 20 that the cable is bent to 90 degrees, but this is not limited thereto. The bent angle of the cable may be variously controlled by controlling the lengths of the first and second ground members 150a and 150b exposed in the first connection terminal 191a.

Figure 21:
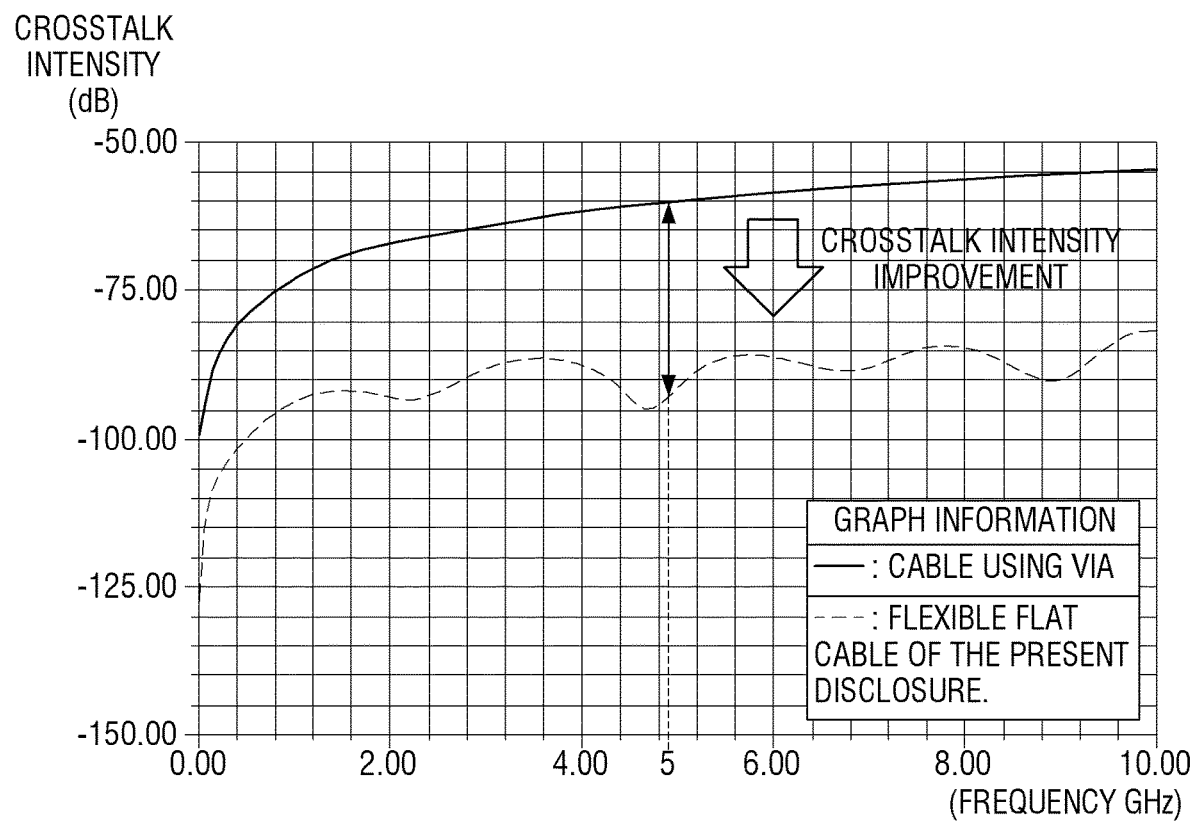
FIG. 21 is a graph illustrating a comparison result of signal crosstalk degree between a flexible flat cable in the related art and a flexible flat cable according to an example embodiment.

FIG. 21 is a graph illustrating a comparison result of signal crosstalk degree between a flexible flat cable in the related art and an example flexible flat cable according to an example embodiment.

The degrees of crosstalk of a signal cable using a via in the related art and a flexible flat cable according to an example embodiment are compared to verify an effect of the flexible flat cable according to an example embodiment.

The crosstalk intensity in dB of the signal cable over the frequency (GHz) in the related art is indicated by a solid line and the crosstalk intensity of the flexible flat cable over the frequency in the example embodiment is indicated by a dotted line.

It can be seen from the graph that the crosstalk degree may be improved over the whole frequency domain as compared with the signal cable using a via in the related art as shown by the single headed arrow.

It can be seen that the crosstalk in the flexible flat cable according to an example embodiment is improved by about 31.22 dB in the frequency of about 5 GHz as compared with the signal cable in the related art as shown by the double headed arrow.

The foregoing example embodiments and advantages are merely examples and are not to be understood as limiting the present disclosure. The present teaching can be readily applied to other types of apparatuses. Also, the description of the example embodiments of the present disclosure is intended to be illustrative, and not to limit the scope of the claims, and many alternatives, modifications, and variations will be apparent to those skilled in the art.

What is claimed is:

1. A flexible flat cable comprising:
   a plate-like insulating part comprising an electrically insulating material and including a first insulating layer and a second insulating layer laminated on the first insulating layer, the second insulating layer having a smaller width than a width of the first insulating layer;
   a signal transmission member comprising a conductive material disposed within the insulating part;
   an outer skin covering the insulating part;
   a conductive adhesive layer disposed between the insulating part and the outer skin; and
   a pair of ground members comprising a conductive material disposed over portions of the first insulating layer on which the second insulating layer is not laminated,
   wherein the outer skin comprises a conductive film.

2. The flexible flat cable as claimed in claim 1, wherein the signal transmission member includes a pair of spaced apart strip lines.

3. The flexible flat cable as claimed in claim 1, wherein a step portion exposing the signal transmission member is formed in at least one end of the flexible flat cable so that the flexible flat cable can be electrically coupled to another flexible flat cable, and
   the step portions of the flexible flat cable and the another flexible flat cable to face each other when coupled.

4. The flexible flat cable as claimed in claim 1, wherein the signal transmission member is disposed between the pair of ground members.

5. The flexible flat cable as claimed in claim 4, wherein portions of the pair of ground members are covered with the conductive adhesive layer.

6. The flexible flat cable as claimed in claim 1, wherein the pair of ground members are disposed on the first insulating layer and are respectively disposed on both sides of and spaced apart from the signal transmission member, and
   wherein the conductive adhesive layer protrudes toward the ground members and is electrically coupled to the pair of ground members.

7. The flexible flat cable as claimed in claim 6, wherein the signal transmission member includes a pair of spaced apart strip lines.

8. The flexible flat cable as claimed in claim 6, wherein the conductive adhesive layer includes a pair of connection protrusions coupled to a top surface of the first insulating part and a bottom surface of the second insulating part.

9. The flexible flat cable as claimed in claim 6, wherein the pair of ground members and the conductive adhesive layer completely cover the signal transmission member.

10. The flexible flat cable as claimed in claim 1, further comprising a conductive pattern electrically coupled to one end of the flexible flat cable.

11. A flexible flat cable comprising:
    a plurality of ground parts are spaced apart from each other;
    a plurality of signal transmission parts comprising conductive material disposed between the plurality of ground parts;
    an outer skin covering the plurality of signal transmission parts and the plurality of ground parts; and
    a conductive adhesive layer disposed between the plurality of ground parts, the plurality of signal transmission parts and the outer skin,
    wherein each of the plurality of signal transmission parts comprises a respective insulating member and a respective strip line disposed within the corresponding insulating member,
    wherein each of the plurality of ground parts comprises a respective ground member which is disposed on the same plane as the plurality of signal transmission parts and a corresponding conductive adhesive block coupled to the respective ground member with the conductive adhesive layer,
    wherein the respective insulating member includes a first insulating layer and a second insulating layer laminated on the first insulating layer, the second insulating layer having a smaller width than a width of the first insulating layer,
    each respective ground member comprising a conductive material disposed in portions of the corresponding first insulating layer on which the corresponding second insulating layer is not laminated, and
    wherein the outer skin comprises a conductive film.

12. The flexible flat cable as claimed in claim 11, wherein the plurality of ground parts and the conductive adhesive layer completely cover the plurality of signal transmission parts.

13. The flexible flat cable as claimed in claim 11, wherein the plurality of signal transmission parts are spaced apart from each other.

14. A method of manufacturing a flexible flat cable, the method comprising:
    providing a first insulating layer having a copper thin film layer formed on one surface;
    etching a portion of the copper thin film layer to form a strip line and a pair of ground members;
    laminating a second insulating layer on the etched copper thin film layer;
    etching a portion of the first insulating layer corresponding to the pair of ground members; and
    covering the first and second insulating layers with a shield film to which a conductive adhesive is applied.

15. The method as claimed in claim 14, wherein the etching comprises forming the pair of ground members disposed on both sides of and spaced from the strip line.

16. The method as claimed in claim 15, wherein the second insulating layer includes a longitudinal groove having a shape corresponding to the ground member in a position corresponding to the ground member, and the covering of the first and second insulating layers with the shield film to which the conductive adhesive is applied includes filling the conductive adhesive within the longitudinal groove of the second insulating layer.

17. The method as claimed in claim 14, wherein the laminating of the second insulating layer includes covering the strip line.

\* \* \* \* \*